(12) United States Patent
Cho et al.

(10) Patent No.: US 7,977,172 B2
(45) Date of Patent: Jul. 12, 2011

(54) DYNAMIC RANDOM ACCESS MEMORY (DRAM) CELLS AND METHODS FOR FABRICATING THE SAME

(75) Inventors: Hyun-Jin Cho, Palo Alto, CA (US); Sang H. Dhong, San Jose, CA (US); Jung-Suk Goo, Los Altos, CA (US); Gurupada Mandal, San Jose, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 262 days.

(21) Appl. No.: 12/330,282

(22) Filed: Dec. 8, 2008

(65) Prior Publication Data
US 2010/0144106 A1     Jun. 10, 2010

(51) Int. Cl.
*H01L 21/84* (2006.01)
(52) U.S. Cl. . 438/151; 438/243; 438/386; 257/E21.561; 257/E21.646
(58) Field of Classification Search .......... 438/238–256, 438/151–166, 386–392; 257/E21.561, E21.646
See application file for complete search history.

(56) References Cited

U.S. PATENT DOCUMENTS

| | | | |
|---|---|---|---|
| 3,387,286 A | 6/1968 | Dennard | |
| 4,794,434 A | 12/1988 | Pelley, III | |
| 5,395,786 A | 3/1995 | Hsu et al. | |
| 5,429,972 A | 7/1995 | Anjum et al. | |
| 5,616,961 A * | 4/1997 | Kohyama | 257/774 |
| 5,770,484 A | 6/1998 | Kleinhenz | |
| 6,008,104 A * | 12/1999 | Schrems | 438/386 |
| 6,107,153 A | 8/2000 | Huang et al. | |
| 6,262,448 B1 | 7/2001 | Enders et al. | |
| 6,455,369 B1 | 9/2002 | Forster et al. | |
| 6,566,177 B1 | 5/2003 | Radens et al. | |
| 6,845,033 B2 | 1/2005 | Kirihata et al. | |
| 6,964,897 B2 | 11/2005 | Bard et al. | |
| 7,061,050 B2 | 6/2006 | Fazan et al. | |
| 7,084,450 B2 | 8/2006 | Kito et al. | |
| 7,094,658 B2 | 8/2006 | Chen et al. | |
| 7,129,130 B2 | 10/2006 | Adkisson et al. | |
| 7,177,175 B2 | 2/2007 | Fazan et al. | |
| 7,223,651 B2 | 5/2007 | Richter et al. | |
| 2007/0015327 A1 | 1/2007 | Su | |
| 2007/0158728 A1 | 7/2007 | Cheng et al. | |
| 2007/0218625 A1 | 9/2007 | Ho et al. | |
| 2007/0254417 A1 | 11/2007 | Chen et al. | |
| 2008/0020539 A1 | 1/2008 | Wang et al. | |
| 2008/0122030 A1 | 5/2008 | Cheng et al. | |

OTHER PUBLICATIONS

Mandelman, J.A., et al. "Challenges and Future Directions for the Scaling of Dynamic Random-Access Memory." IBM J. Res. & Dev., vol. 46, No. 2/3. Mar./May 2002.

Innovative Silicon. "ISI Corporate Overview—Apr. 2002—Web Version." http://www.innovativesilicon.com/en/pdf/z-ram.pdf. Apr. 2008.

Halfhill, Tom R. "Z-Ram Shrinks Embedded Memory—Innovative Silicon's Tiny Dram Cells Alter the Memory Equation." Microprocessor Report, Oct. 25, 2005.

* cited by examiner

*Primary Examiner* — Richard A. Booth
(74) *Attorney, Agent, or Firm* — Ingrassia Fisher & Lorenz, P.C.

(57) ABSTRACT

A method for fabricating a memory cell is provided. A trench is formed in a semiconductor structure that comprises a semiconductor layer, and a trench capacitor is formed in the trench. Conductivity determining impurities are implanted into the semiconductor structure to create a well region in the semiconductor layer that is directly coupled to the trench capacitor. A gate structure is formed overlying a portion of the well region. Conductivity determining ions are then implanted into other portions of the well region to form a source region and a drain region, and to define an active body region between the source region and the drain region. The active body region directly contacts the trench capacitor.

27 Claims, 8 Drawing Sheets

DYNAMIC RANDOM ACCESS MEMORY (DRAM) CELLS AND METHODS FOR FABRICATING THE SAME

TECHNICAL FIELD

The present invention generally relates to semiconductor devices and to methods for their fabrication, and more particularly relates to Dynamic Random Access Memory (DRAM) cells and to methods for their fabrication.

BACKGROUND

Dynamic Random Access Memory (DRAM) is a type of volatile random access memory that stores each bit of data in a separate DRAM cell. A DRAM integrated circuit (IC) includes an array of DRAM cells interconnected by rows of word lines and columns of bit lines. Each DRAM cell must be periodically refreshed to ensure that the information it stores is not lost when it is not powered.

FIG. 1 is a circuit schematic which illustrates a conventional one transistor/one capacitor (1T/1C) dynamic random access memory (DRAM) cell 2, and will be described with reference to FIG. 2, which illustrates two conventional 1T/1C DRAM cells 2, 4 in plan view, and with reference to FIG. 3, which illustrates one of the 1T/1C DRAM cells 2 of FIG. 2 along cross section 3-3 of FIG. 2. The DRAM cell 2 consists of a metal oxide semiconductor field effect transistor (MOSFET) 50 in series with a storage capacitor 70 that stores electric charge representing a binary bit of data.

The MOSFET 50 is commonly referred to as an access transistor since it controls read and write access to the storage capacitor 70. The access transistor 50 includes a gate structure 17, 20 that is interposed between a source and a drain 30, 40. The gate structure 17, 20 includes a gate electrode 20 that is formed overlying a gate oxide layer 17. The gate electrode 20 of the access transistor 50 is coupled to a word line 4 of the DRAM cell 2. The gate oxide layer 17 serves as insulator between the gate electrode 20 and a channel of the access transistor 50. As illustrated in FIG. 3, the source and drain 30, 40 are formed in a semiconductor substrate 9 and spaced apart by an active body region 35. The channel is defined in the active body region 35 of semiconductor substrate 9 between the source and drain 30, 40. A bit line 10 is coupled to the source 30 of the access transistor 50.

One type of storage capacitor that is commonly employed in a DRAM cell is a trench capacitor. A trench capacitor is a three-dimensional structure formed within a deep trench etched into a semiconductor substrate. FIGS. 2 and 3 illustrate one implementation of a trench storage capacitor 70 that includes an upper electrode 76 separated from a lower electrode 72 by a thin dielectric layer 74. The access transistor 50 serves as a switch for controlling the charging and discharging of the storage capacitor 70, writing information onto the storage capacitor 70, and reading information from the storage capacitor 70. As illustrated in FIGS. 1 and 3, the upper electrode 76 of the storage capacitor 70 is coupled to the drain 40 of the access transistor 50 such that the access transistor 50 can control the flow of current between the bit line 10 and the storage capacitor 70, and vice-versa. By controlling the voltages applied to the source electrode 30 and the gate electrode 20, writing and reading operations can be performed.

Data is written by raising the voltage applied to the word line 4 to turn the access transistor 50 on, and applying a high or low voltage level to the bit line 10 to write a high or low voltage level onto the storage capacitor 70. Lowering the voltage applied to the word line 20 turns the access transistor 50 off thereby trapping charge on the storage capacitor 70 and hence storing the data.

To read the DRAM cell 2, the bit line 10 is precharged midway between high and low voltage levels, the access transistor 50 is turned on by raising voltage applied to word line 4, and the charge stored on the storage capacitor 70 is allowed to flow onto the bit line 10, which creates a small signal voltage on the bit line 10, which can then be detected by a sense amplifier (not illustrated). When the amount of charge stored at the storage capacitor 70 is above a certain level this can be interpreted as a logic one (1) state, and when the amount of charge stored by the storage capacitor 70 is below the level this can be interpreted as a logic zero (0) state. More precisely, data is read by (1) precharging the bit line 10 midway between the high and low levels, (2) raising the voltage applied to the word line 4 to turn the access transistor 50 on, and (3) sensing the voltage change (commonly referred to as "signal voltage" ($V_{signal}$)) on the bit line 10 that is caused by sharing charge between the storage capacitor 70 ($C_{storage}$) and parasitic capacitance ($C_{bitline}$) associated with the bitline 10. The signal voltage ($V_{signal}$) can be determined as shown in Equation (1), $$V_{signal} = 0.5 * V_{storage} * C_{storage} / (C_{bitline} + C_{storage}) \quad (1),$$

where $V_{storage}$ is the voltage difference between the stored high and low levels on the storage capacitor 70, and $C_{bitline}$ is the parasitic capacitance of the bit line 10 including input capacitance of the sense amplifier (not shown). The extent to which the actual voltage difference ($V_{storage}$) between the stored high and low levels on the storage capacitor 70 approaches the voltage swing on the bit line 10 (i.e., bit line-high voltage ($V_{BLH}$) minus bit line-low voltage ($V_{BLL}$), which is usually zero), is determined by the current provided by the access transistor 50, the value of the storage capacitor 70, and the amount of time allocated for the transfer of charge between the bit line 10 and the storage capacitor 70.

As new generations of DRAM are designed, technologists continue to search for new ways to reduce the size of the DRAM cell and/or to improve performance of the DRAM cell. One approach to reducing DRAM cell-size involves completely eliminating the storage capacitor 70. FIG. 4 is a circuit schematic which illustrates a conventional one transistor (1T) DRAM cell 102, and will be described with reference to FIG. 5, which illustrates two conventional 1T DRAM cells 102, 104 in plan view, and with reference to FIG. 6, which illustrates one of the conventional 1T DRAM cells 102 of FIG. 5 along cross section 6-6 of FIG. 5. The DRAM cell 102 consists of an access transistor 150 that performs both a state storage function and an access control function so that a separate storage capacitor is not needed. Instead, the active body region 135 of the access transistor 150 is used for data storage.

To explain further, the access transistor 150 is formed in and on a silicon-on-insulator (SOI) structure 102 that includes a carrier substrate 105, a buried oxide layer 107 and a thin semiconductor substrate 109. The gate structure 117, 120, source 130 and drain 140 are similar to those described above with respect to FIGS. 1-3 except that they are formed on and in the semiconductor substrate 109 that overlies the buried oxide layer 107. The active body region 135 of the access transistor 150 has an inherent parasitic capacitance associated with it because it is formed in the thin semiconductor substrate 109. During operation, the active body region 135 is left electrically floating, which is different from a bulk transistor where body is connected to fixed body voltage. The active body region 135 is left in a floating state so that it can be charged up or discharged. The well-known "floating body effect" leads to the development of charge in the active body region 135 that can be used to store "1" or "0" binary data states in the DRAM cell 102. For example, by applying control signals to word line 104 and bit line 110, majority charge carriers can be accumulated in the active body region 135. This property can be used to write data to DRAM cell 102. In addition, because the threshold voltage ($V_{TH}$) required to turn on the access transistor 150 changes depending upon the amount of charge stored in the active body region 135, changes in the threshold voltage ($V_{TH}$) of the access transistor 150 can be used to read data states stored by the DRAM cell 102.

For instance, when the access transistor 150 is an NMOS-FET, the active body region 135 is P-type semiconductor material, in which "holes" are "more abundant" and evenly distributed throughout the active body region 135. The DRAM cell 102 can write and store a logic one (1) or high data state by accumulating excess holes in the active body region 135. When the access transistor 150 is turned on by applying a voltage to the gate that exceeds the threshold voltage of the access transistor 150, electrons will flow from the source 140 to the drain 140. As charges balance at the p-n junction between the active body region 135 and the drain 140, holes accumulates in the active body region to balance the charge on each side of the junctions with equal and opposite charges. The DRAM cell 102 can write or store logic zero (0) or low data state when an excess of holes are not present in the active body region 135.

To write and store a logic one (1) or high data state, majority carrier holes are accumulated in the active body region 135 by applying a voltage to the gate 120 and positively biasing the drain region 140 with respect to the source region 130 to generate excess holes and produce a residual positive charge in the active body region 135. The threshold voltage ($V_{TH}$) required to turn on the access transistor 150 changes based on the amount of holes (i.e., positive charges) stored in the active body region 135. In particular, this residual positive charge increases the threshold voltage ($V_{TH}$) required to turn the access transistor 150 on because more voltage must be applied to the gate to repel holes. As will be explained below, this increased threshold voltage ($V_{TH}$) can be detected and interpreted as a logic one (1) since lower threshold voltage ($V_{TH}$) decreases the drain-to-source current ($I_{ds}$) flowing through the channel.

By contrast, to write and store a logic zero (0) or low data state in the DRAM cell 102, from the absence of an abudance of holes in the active body region 135 decreases the threshold voltage ($V_{TH}$) required to turn the access transistor 150 on because less voltage must be applied to the gate 120 to repel positive charges. As will be described below, this decreased threshold voltage ($V_{TH}$) can be read or interpreted as a logic zero (0) since higher threshold voltage ($V_{TH}$) increases the drain-to-source current ($I_{ds}$) flowing through the channel.

Unlike the conventional DRAM cell 2 illustrated in FIGS. 1-3 that implements a trench capacitor, a read operation does not involve directly measuring the quantity of charge present in the active body region 135, but instead the change in the threshold voltage ($V_{TH}$) required to turn on the access transistor 150 can be used to determine whether the memory cell 102 is storing a logic one (1) or high versus a logic zero. The drain-to-source current ($I_{ds}$) will either increase or decrease depending on the threshold voltage ($V_{TH}$), which, as noted above, changes depending on the charge stored in the active body region 135. An increase in the drain-to-source current ($I_{ds}$) can be interpreted as a logic one, whereas a decrease in the drain-to-source current ($I_{ds}$) can be interpreted as a logic zero. To read the data stored in the DRAM cell 102, a small pulse is applied to the gate electrode 120 of the access transistor 150 via wordline 104, which turns the access transistor 150 on and causes a drain-to-source current ($I_{ds}$) to flow into the bit line 110. A current sense amplifier (not illustrated) compares drain-to-source current ($I_{ds}$) generated by the access transistor 150 to a reference current provided by a reference cell (not illustrated). From that comparison, it may be determined whether DRAM cell 102 is storing a logic high (relatively more majority carriers contained within body region 135) or logic low data state (relatively less majority carriers contained within body region 135).

Although the DRAM cell 102 has a smaller cell size than a conventional DRAM cell 2, the DRAM cell 102 has diminished data-retention characteristics since a smaller number of charges can be stored in the active body region 135. In general, the capacitance of the DRAM cell 102 is 100 times smaller than a conventional DRAM cell 2 that implements a trench storage capacitor 70.

Notwithstanding the density improvements provided by 1T DRAM cells, data-retention time of DRAM cells continues to be an important consideration since it directly affects power dissipation and memory speed.

As such, it is desirable to provide improved DRAM cells that use the floating body effect to store information and methods for fabricating such DRAM cells. For example, it is desirable to improve charge storage capacity (i.e., capacitance) of such DRAM cells to increase data retention time, improve disturb characteristics and to improve their reliability. Furthermore, other desirable features and characteristics of the present invention will become apparent from the detailed description and the appended claims, taken in conjunction with the accompanying drawings and the foregoing technical field and background.

BRIEF SUMMARY

In accordance with one embodiment, a semiconductor memory cell is provided that includes a trench capacitor and an access transistor. The access transistor comprises a source region, a drain region, a gate structure overlying the trench capacitor, and an active body region that couples the drain region to the source region. The active body region directly contacts the trench capacitor.

In another embodiment, a method for fabricating a memory cell is provided. According to one embodiment, a trench is formed in a semiconductor structure that comprises a semiconductor layer, and a trench capacitor is formed in the trench. Conductivity determining impurities are implanted into the semiconductor structure to create a well region in the semiconductor layer that is directly coupled to the trench capacitor. A gate structure is formed overlying a portion of the well region. Conductivity determining ions are then implanted into other portions of the well region to form a source region and a drain region, and to define an active body region between the source region and the drain region. The active body region directly contacts the trench capacitor.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. The word "exemplary" is used herein to mean "serving as an example, instance, or illustration." Any embodiment described herein as "exemplary" is not necessarily to be construed as preferred or advantageous over other embodiments. All of the implementations described below are exemplary implementations provided to enable persons skilled in the art to make or use the invention and are not intended to limit the scope of the invention which is defined by the claims. Furthermore, there is no intention to be bound by any expressed or implied theory presented in the preceding technical field, background, brief summary or the following detailed description.

For the sake of brevity, conventional techniques related to transistor design and manufacturing, the control of memory devices, memory cell programming, memory cell erasing, and other functional aspects of the devices and systems (and the individual operating components of the devices and systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the invention.

The following description refers to elements or nodes or features being "connected" or "coupled" together. As used herein, unless expressly stated otherwise, "connected" means that one element, node or feature is directly joined to (or directly communicates with) another element, node or feature. Likewise, unless expressly stated otherwise, "coupled" means that one element, node or feature is directly or indirectly joined to (or directly or indirectly communicates with) another element, node or feature.

In the description and the claims, numerical ordinals, such as the terms "first," "second," "third," "fourth," if any, may be used for distinguishing between similar elements and not necessarily for describing a particular sequential or chronological order. It is to be understood that the terms so used are interchangeable. Under appropriate circumstances, embodiments of the invention described herein are capable of fabrication or operation in sequences other than those illustrated or otherwise described herein.

Furthermore, the terms "comprise," "include," "have," and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

Figure 7:
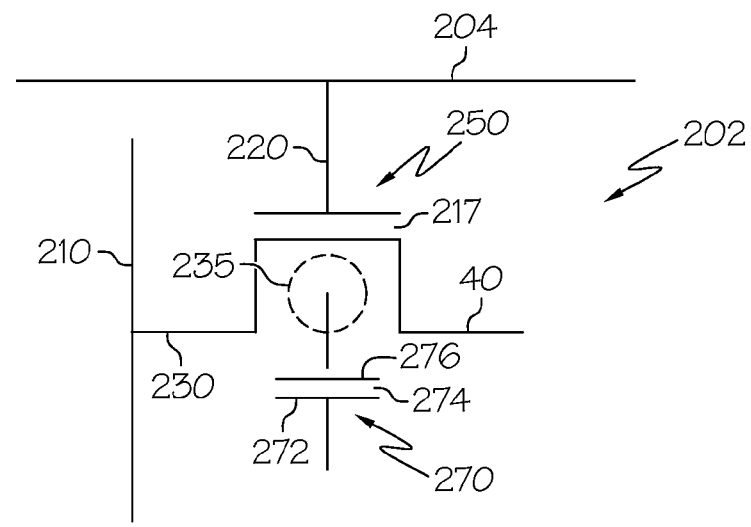
FIG. 7 is a circuit schematic which illustrates a dynamic random access memory (DRAM) cell in accordance with an embodiment of the present invention.
Figure 8:
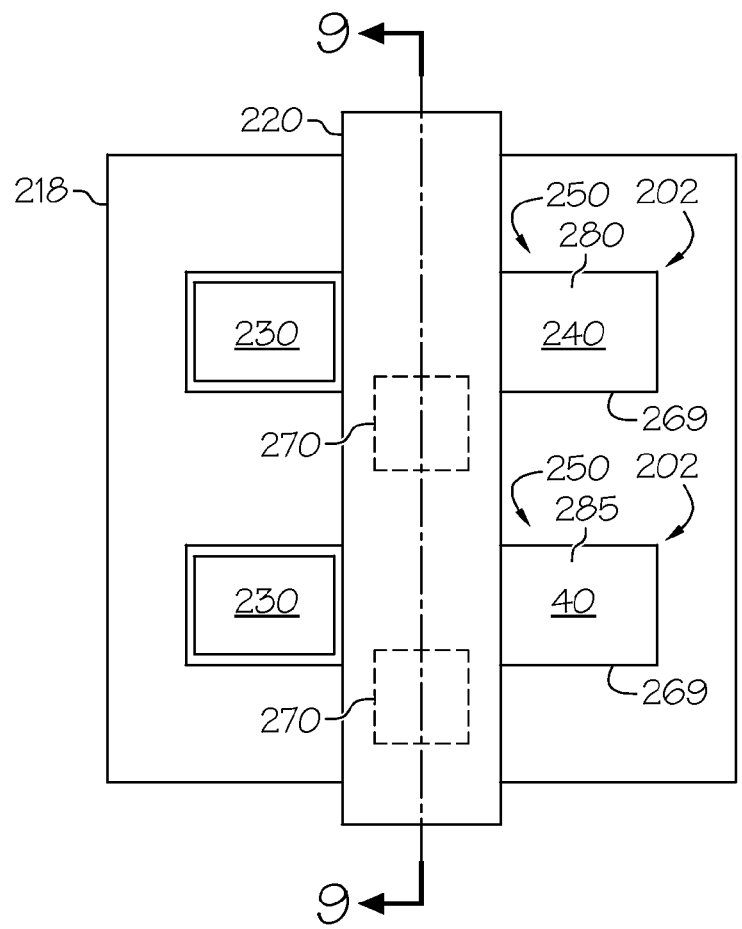
FIG. 8 illustrates, in plan view, DRAM cells in accordance with an embodiment of the present invention.
Figure 9:
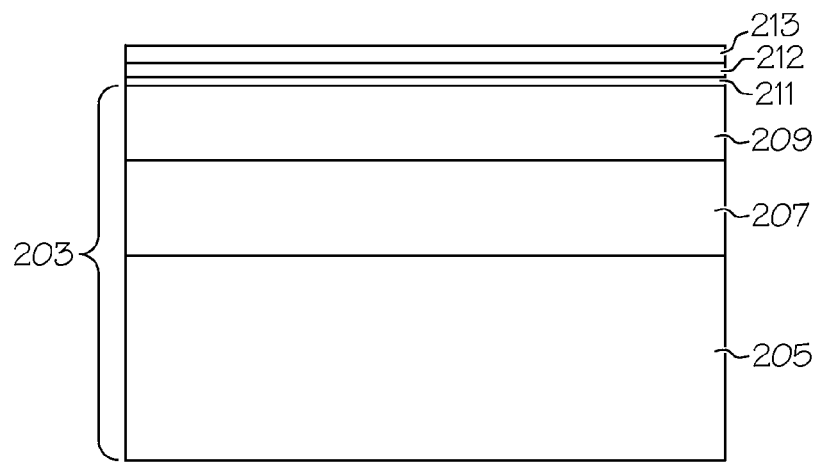
FIGS. 9-19 illustrate, in cross section, DRAM cells and method steps for their fabrication in accordance with various embodiments of the invention.

FIG. 7 is a circuit schematic which illustrates a dynamic random access memory (DRAM) cell 202 in accordance with an embodiment of the present invention. FIG. 8 illustrates, in plan view, two dynamic random access memory (DRAM) cells 202, 204 in accordance with an embodiment of the present invention. For sake of brevity, FIG. 7 will be described with reference to FIG. 8, and only one of the DRAM cells, namely DRAM cell 202, will be described. The DRAM cell 202 includes an access transistor 250 and a trench capacitor 270.

The access transistor 250 serves as a switch for controlling the charging and discharging of the storage capacitor 270, for writing of logic states into the storage capacitor 270, and for reading of logic states from the storage capacitor 270. The access transistor 250 includes a source region 230, a drain region 240, an active body region 235 disposed between the source region 230 and the drain region 240, and a gate electrode 220. The gate electrode 220 is capacitively coupled to the active body region 235 via gate insulator 217. The gate insulator 217 and the active body region are not illustrated in the plan view of FIG. 8. The active body region is a portion of a well region 280 that underlies and is spaced apart from the gate electrode 220 such that the active body region is capacitively coupled to the gate electrode 220 via a gate insulator layer.

The trench capacitor 270 includes electrodes 272, 276 and a dielectric insulator layer 274 between the electrodes 272, 276. The trench capacitor 270 is preferably located under the gate electrode 220 and/or word line and contacts the active body region 235 such that the trench capacitor 270 is physically, directly and capacitvely coupled to the active body region 235. In the particular embodiment of FIG. 8, the trench capacitor 270 contacts an edge 269 of the active body region such that the trench capacitor 270 is physically, directly and capacitvely coupled to the active body region of the access transistor 250.

As described in detail below, during operation the DRAM cell 202 uses the "floating body effect" to store charge that represents data in the active body region. By integrating the trench capacitor 270 in contact with the active body region 235, the charge storage capacity (i.e., capacitance) of the DRAM cell 202 is increased, which increases data retention time and improves reliability of DRAM cell 202.

FIGS. 9-19 illustrate, in cross section, DRAM cells 202, 204 and method steps for their fabrication in accordance with various embodiments of the invention. In the illustrative embodiments described below, method steps for fabricating DRAM cells 202, 204 will be described in which DRAM cells 202, 204 are fabricated in and on a semiconductor-on-insulator (SOI) structure 203; however, similar techniques may be used to fabricate DRAM cells in and on a bulk semiconductor substrates. Moreover, in the illustrative embodiments described below, method steps for fabricating DRAM cells 202, 204 will be described in which the access transistors 250, 254 of the DRAM cells 202, 204 are NMOSFET devices; however, similar method steps can be used to manufacture DRAM cells 202, 204 in which the access transistors 250, 254 are PMOSFET devices. Although the term "MOSFET device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate (whether silicon or other semiconductor material). Those of skill in the art will understand that the DRAM cells 202, 204 are part of a DRAM array that generally includes a large number of DRAM cells 202, 204.

Various steps in the manufacture of DRAM cells 202, 204 are well known and so, in the interest of brevity, many conventional steps will only be mentioned briefly herein or will be omitted entirely without providing the well known process details.

The manufacture begins with providing a semiconductor structure or substrate in and on which DRAM cells 202, 204 are fabricated. The semiconductor substrate can be either a bulk semiconductor material or a semiconductor-on-insulator (SOI) substrate. In accordance with an embodiment of the invention illustrated in FIG. 9, the manufacture begins with providing a semiconductor-on-insulator (SOI) structure 203 in and on which DRAM cells 202, 204 will be fabricated. The SOI structure 203 comprises at least one thin layer of semiconductor material 209 disposed on or overlying a buried oxide insulating layer 207 which, in turn, is supported by a carrier wafer or substrate 205 so that the buried oxide insulating layer 207 is disposed between the carrier wafer 205 and the semiconductor layer 209. The semiconductor layer 209 can be a thin silicon layer, a germanium layer, a silicon germanium layer, a gallium arsenide layer, or other semiconductor materials. In one embodiment, the semiconductor material layer 209 comprises a thin monocrystalline layer of silicon on the buried oxide insulating layer 207. The thin silicon layer may be a relatively pure silicon material, or a layer of silicon material doped with impurity dopant elements such as boron, phosphorus, and arsenic, to form a substantially monocrystalline semiconductor material. In one implementation, the carrier substrate is p-type silicon material, and the buried oxide insulating layer 207 can be, for example, a silicon dioxide layer, which has a thickness of about 50-200 nm.

A pad layer 211, a pad stop layer 212, and a hard mask layer 213 are sequentially formed overlying the semiconductor layer 209 to protect the semiconductor layer 209 from damage and to cover the semiconductor layer 209 during subsequent processing steps. In one exemplary implementation, the pad layer 211 can be a silicon dioxide ($SiO_2$) layer 211 that is formed, for example, by thermal oxidation of the semiconductor layer 209, chemical vapor deposition (CVD) or other techniques know in the art. The pad stop layer 212 can be formed overlying the silicon dioxide layer 211, for example, by CVD. In one implementation, the pad stop layer 212 can be a blanket layer of silicon nitride ($Si_3N_4$) 212. The hard mask layer 213 is formed overlying pad stop layer 212, and can be any hard mask material, such as, another silicon dioxide layer 213, or alternatively, tetraethyl orthosilicate (TEOS), $Si(OC_2H_5)_4$ based silicon dioxide layer 213. Other combinations of hard mask layers 211, 212, 213 can also be used, and one of ordinary skill in the semiconductor arts will appreciate that either fewer or more protective layers can be formed overlying 209.

Although not illustrated, a layer of photosensitive material, such as a layer of photoresist, is applied to the surface of the hard mask layer 213. As is well known to those of skill in the art, adhesion promoters (not illustrated) and/or antireflective coatings may be applied to the surface of the hard mask layer 213 before the photosensitive material is applied. Photosensitive material can be selected from the well known and commercially available photoresist materials, and can be applied using, for instance, spin coating techniques. The photosensitive material is patterned using photolithography methods to define a mask that has openings that expose portions of the hard mask layer 213 in which first trenches 271 will be formed.

Figure 10:
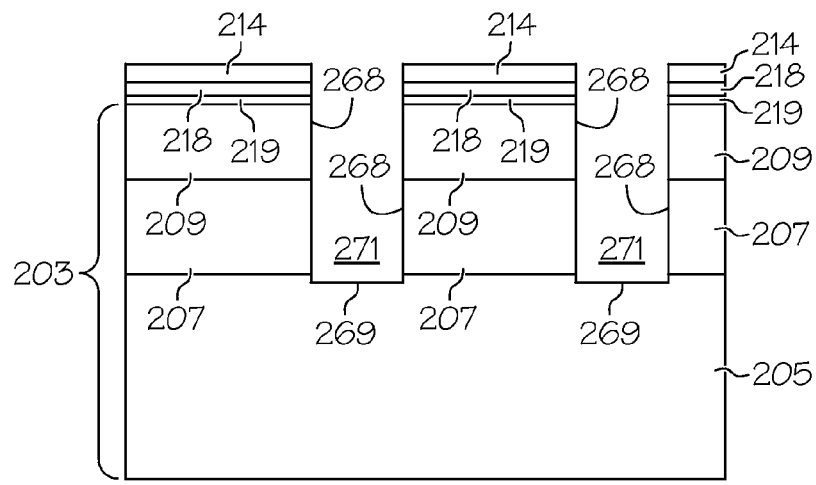

As illustrated in FIG. 10, first trenches 271 can then be etched into the SOI structure 203 using directional or "anisotropic" etching techniques, such as reactive ion etching (RIE) techniques. Etching can be performed using a multi-step process to etch openings through the hard mask layer 213, the pad stop layer 212, the pad layer 211, the semiconductor layer 209, the buried oxide insulating layer 207, and into a portion of the carrier substrate 205. Etchants used to anisotropically etch the pad layer 211, hard mask layer 213 and pad stop layer 212 can be selected such that etching selectively stops upon reaching the pad stop layer 212 after etching through the hard mask layer 213, and such that etching selectively stops upon reaching the pad layer 211 after etching through the pad stop layer 212. The pad layer 211, hard mask layer 213 and pad stop layer 212 can be etched, for example, in a $CHF_3$, $CF_4$, or $SF_6$ chemistry. Similarly, etchants used to anisotropically etch the semiconductor layer 209, the buried oxide insulating layer 207, and the portion of the carrier substrate 205 can be selected such that etching selectively stops upon reaching the buried oxide insulating layer 207 after etching through the semiconductor layer 209, and such that etching selectively stops upon reaching the carrier substrate 205 after etching through the buried oxide insulating layer 207. The first trenches 271 each include sidewalls 268 and a bottom 269.

Figure 11:
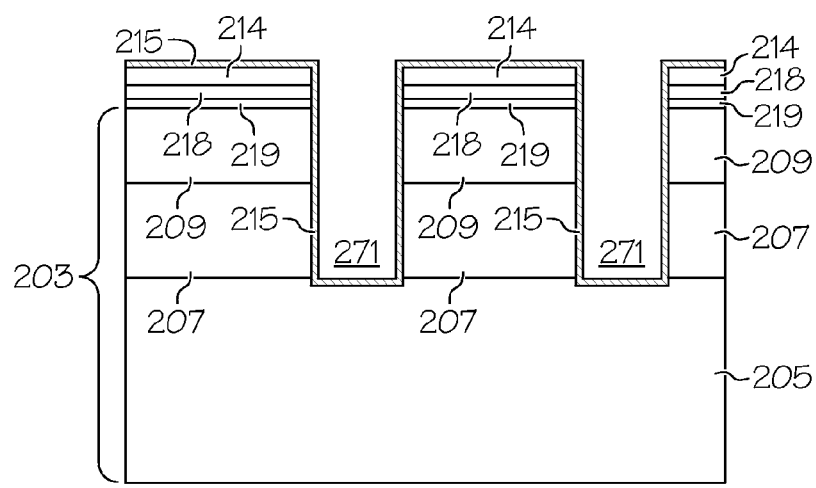

As illustrated in FIG. 11, a dielectric layer 215 of spacer forming material is conformally deposited overlying remaining portions 214 of the hard mask layer 213, sidewalls 268 of the first trenches 271 and the bottom 269 of the first trenches 271. In one exemplary embodiment, the dielectric layer 215 comprises a silicon nitride layer 215 that is conformally blanket deposited to form a thin layer of silicon nitride. The dielectric layer 215 can be deposited using techniques such as by chemical vapor deposition (CVD) or physical vapor deposition (PVD).

Figure 12:
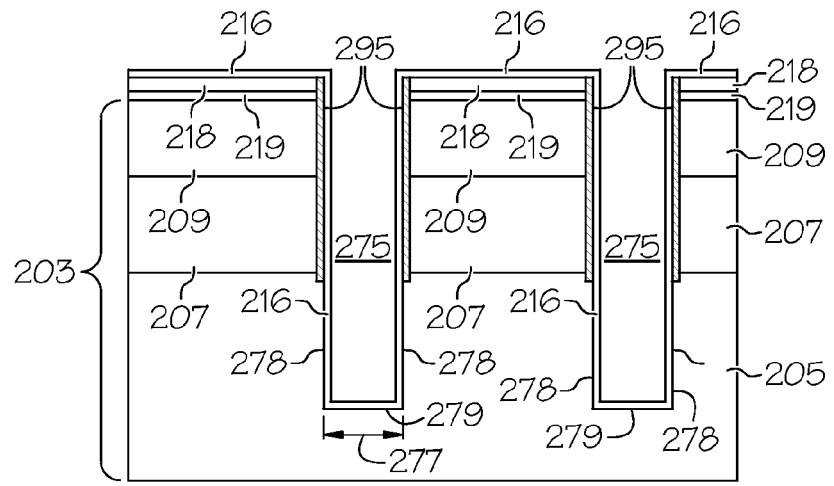

The dielectric layer 215 is anisotropically etched to remove the dielectric layer 215 from all horizontal surfaces, including the bottom 269 of the first trenches 271, and to leave the dielectric layer 215 on vertical surfaces, as illustrated in FIG. 12. The portions 295 of dielectric layer 215 that remain on the vertical surfaces of the first trenches 271 form protective spacers 295 that extend from near the top of the original trench surface to the bottoms 269 of the first trenches 271. The protective spacers 295 protect the exposed edges of the semiconductor layer 209 and buried insulator layer 207 from undesired processing during subsequent processing steps, such as, doping. Although not illustrated, remaining portions 214 of the hard mask layer 213 can then be removed.

As also illustrated in FIG. 12, exposed portions of the carrier substrate 205 in the bottoms 269 of the first trenches 271 are then anisotropically etched, using the pad stop layer 212 and the protective spacers 295 as the etch mask. The carrier substrate 205 can be selectively etched using a plasma etch chemistries that provide high selectivity to pad layer 213 and protective spacers 295 so that removal of pad layer 213 and protective spacers 295 is limited. After etching, the trenches 275 extend further into the carrier substrate 205. Although not illustrated, in some implementations the lower portion 278, 279 of the trenches 275 in the carrier substrate 205 can be enlarged by isotropically etching away exposed portions of the carrier substrate 205 to expand the lateral dimension 277 of the portion of the trenches 275 that are formed in the carrier substrate 205.

Figure 13:
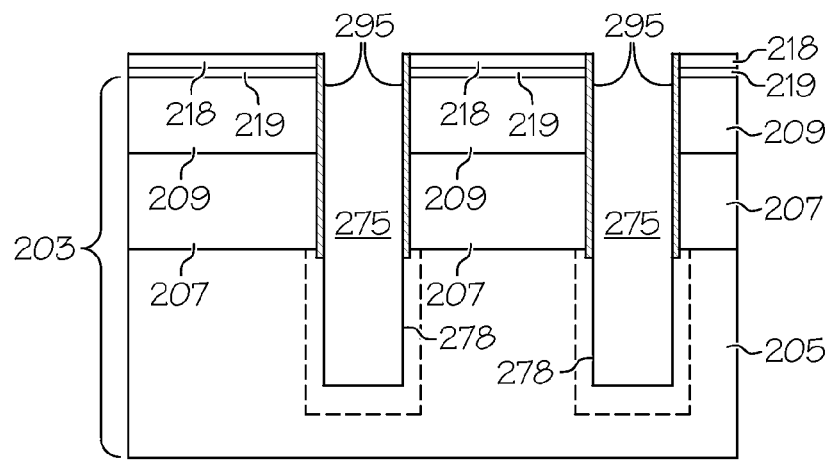

After extending the trenches 275, a buried plate electrode 272 of the trench capacitor 270 can be formed by doping exposed portions of the carrier substrate 205 that surround lower portions 278, 279 of the trenches 275 as illustrated in FIG. 13. Doping can be performed by introducing a dopant source into the trenches 275 and then thermally diffusing the dopant into portions of the carrier substrate 205 that surround lower portions 278, 279 of the trenches 275. The dopant source material may be a dopant such as arsenic (As) or phosphorous (P) when forming an n-type buried plate electrode 272, or, boron (B) when forming a p-type buried plate electrode 272. In the exemplary implementation illustrated in FIG. 12, an n-type doped layer 216 of silicate glass, such as arsenic-doped silicate glass (ASG) or phosphosilicate-doped silicate glass (PSG), is conformally blanket deposited overlying exposed remaining portions 214 of the hard mask layer 213, exposed sidewalls of the protective spacers 295, and the sidewalls 278 and bottoms 279 of the trenches 275. The doped layer 216 can be deposited using deposition techniques such as CVD or PVD.

As illustrated in FIG. 13, dopants in the doped layer 216 are thermally diffused into portions 278, 279 of the carrier substrate 205 that contact the doped layer 216 to form buried plate electrodes 272, which are illustrated by dotted lines that illustrate dopant penetration into adjacent portions 272 of the carrier substrate 205. In one exemplary implementation, a rapid thermal anneal is performed to cause dopants in the doped layer 216 to out-diffuse into portions 272 of the carrier substrate 205 that contact the doped layer 216. During the formation of the buried plate electrode 272, the protective spacers 295 protect the semiconductor layer 209 and buried insulator layer 207 from undesired doping. The doped layer 216 can then be removed.

Figure 14:
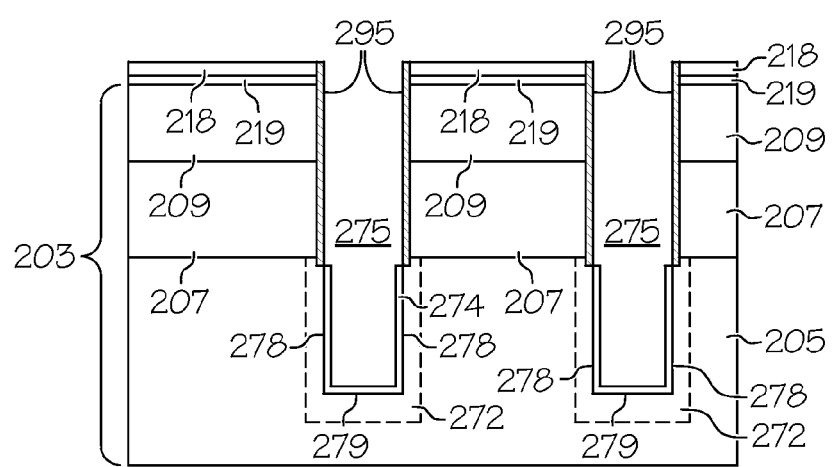

As illustrated in FIG. 14, a dielectric layer 274 is formed on exposed sidewalls 278 and bottom portions 279 of the trenches 275. The dielectric layer 274 may include any insulators appropriate for forming a trench capacitor, such as, silicon dioxide, silicon nitride, silicon oxynitride, high-k material having a relative permittivity, or any combination of these materials. In one implementation, the dielectric layer 274 can be grown, for example, by thermal oxidation and/or nitridation. In this implementation, the pad stop layer 212 and the protective spacers 295 prevent formation of dielectric layer 274 on the semiconductor layer 209 and buried insulator layer 207 so that the dielectric layer 274 forms only on the silicon along the exposed sidewalls 278 and bottom portions 279 of the trenches 275. In some implementations, the dielectric layer 274 may be a layer of high-k insulating material having a dielectric constant (κ) that is high relative to silicon dioxide (i.e., has a κ value of greater than about 4). Examples of "high-κ dielectric" materials include metal silicates, such as hafnium silicates ($HfSiO_4$, HfSiON, $HfSi_xO_y$, or $HfSi_xO_yN_z$) and zirconium silicates ($ZrSiO_4$, ZrSiON), and metal oxides, such as, hafnium oxide ($HfO_2$), $Al_2O_3$, $ZrO_2$, $Y_2O_3$, $La_2O_3$, $TiO_2$, $Ta_2O_5$, $BaTiO_3$. High-k insulating materials can be deposited, for example, by chemical vapor deposition (CVD), low pressure chemical vapor deposition (LPCVD), plasma enhanced chemical vapor deposition (PECVD) or atomic layer deposition (ALD).

Figure 15:
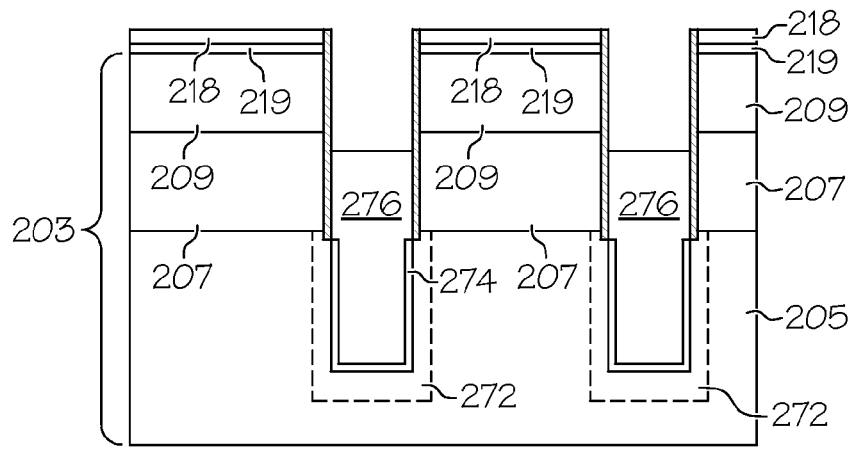

A doped polycrystalline silicon layer 276 (hereinafter "doped polysilicon layer") is deposited to fill at least a portion of the trenches 275 using, for example, CVD. In one implementation, the doped polysilicon layer 276 overlies exposed remaining portions of the silicon pad stop layer 212, protective spacers 295 and dielectric layers 274. A planarization process can be performed, such as chemically mechanical polishing (CMP), to remove portions of the doped polysilicon layer 276 and make the doped polysilicon layer 276 substantially co-planar with pad layer 212. As illustrated in FIG. 15, a portion of the doped polysilicon layer 276 can be etched, for example, in a $CHF_3$, $CF_4$, or $SF_6$ chemistry to recess the doped polysilicon layer 276 and leave a polysilicon plug 276 that lies below the semiconductor layer 209 and is partially surrounded by the protective spacers 295 in a portion of the buried oxide insulating layer 207 and the dielectric layers 274 in the carrier substrate 205. The polysilicon plug 276 eventually forms part of an upper plate of the trench capacitor 270.

Figure 16:
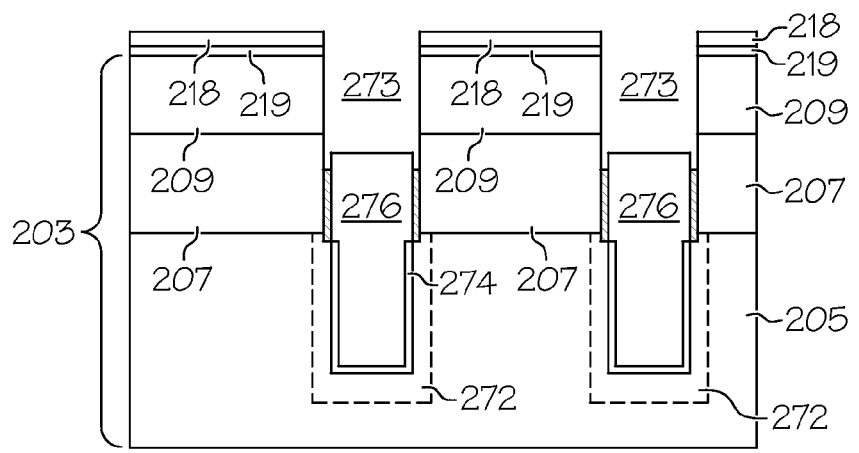

Remaining portions 218 of the pad stop layer 212 and portions of the protective spacers 295 are removed as illustrated in FIG. 16. For instance, in one exemplary implementation, the remaining portions 218 of the pad stop layer 212 and upper portions of the protective spacers 295 are selectively "wet" etched with respect to the polysilicon plug 276 using, for example, a solution of hot phosphoric acid ($H_3PO_4$) to etch nitride or hydrofluoric (HF) acid to etch oxide. Etching stops before the entirety of the protective spacers 295 are removed leaving remaining portions 297 of the protective spacers 295 intact.

Figure 17:
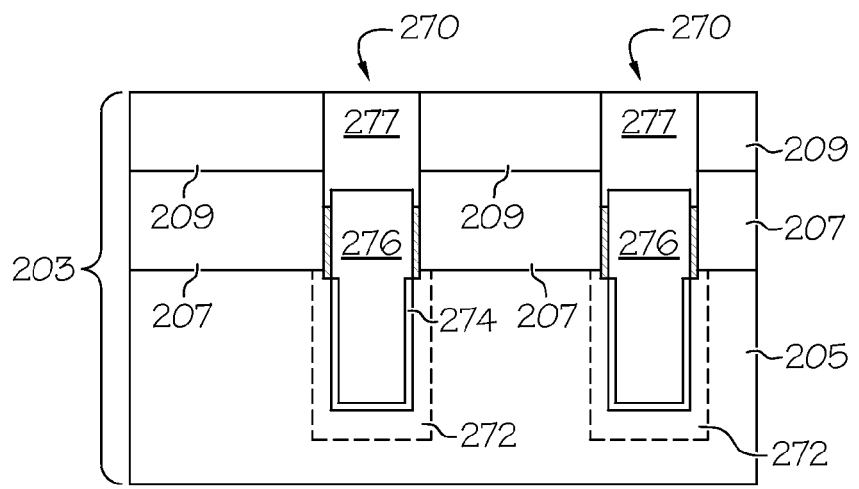

An upper electrode of the trench capacitor 270 is completed by depositing a conductive layer 277 to fill the remainder 273 of trenches 275, as illustrated in FIG. 17. The conductive layer 277 can be formed using techniques such as CVD, physical vapor deposition (PVD), sputtering, etc. The conductive layer 277 may include, for example, amorphous silicon, polycrystalline silicon (hereinafter "polysilicon"), germanium, silicon germanium, a metal (e.g., tungsten, titanium, tantalum, ruthenium, cobalt, copper, aluminum, molybdenum, nickel, rhenium, platinum, etc.), a conducting metallic compound material including metal nitrides (e.g., tungsten nitride, titanium nitride, tantalum nitride, etc.) and metal silicides (e.g., tungsten silicide, cobalt silicide, nickel silicide, etc.), or any combination of these materials. The material of the conductive layer 277 may be doped with dopants to improve conductivity. In one implementation, the conductive layer 277 comprises a heavily n-type doped polysilicon layer that is blanket deposited using, for example, LPCVD to fill the remainder 273 of trenches 275 including the space between the remaining portions 297 of the protective spacers 295 and the polysilicon plug 276. Portions of the polysilicon 277 that reside above the polysilicon plug 276 can then be removed by selective wet or dry etching with respect to nitride. The remaining portions of polysilicon layer 277 form "straps" that physically and electrically connect the polysilicon plugs 276 to the semiconductor layer 209. At this point in the fabrication sequence, the trench capacitors 270 are complete and each includes an upper electrode 277/276, a dielectric layer 274, and a lower buried plate electrode 272. Remaining portions 219 of the pad layer 211 can also be removed.

Figure 18:
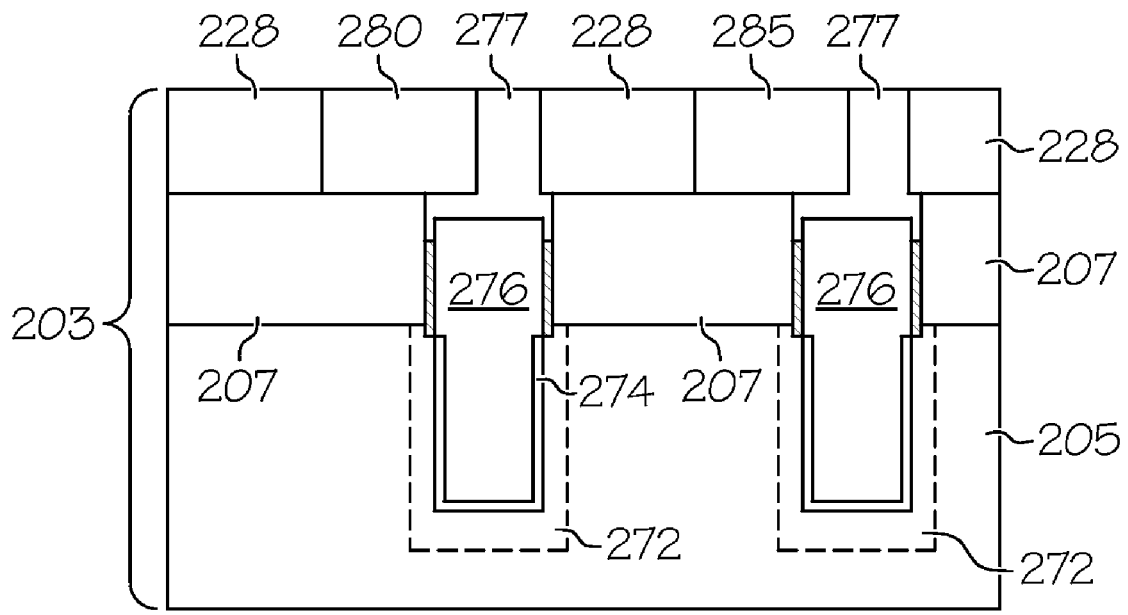

Portions of the semiconductor layer 209 can be impurity doped with P-type conductivity determining impurities to create P-well regions 280, 285 in the semiconductor layer 209, as illustrated in FIG. 18. The P-well regions 280, 285 are directly coupled to the remaining "strap" portions of polysilicon layer 277 to electrically connect the upper electrodes 277/276 of the trench capacitors 270 to the P-well regions 280, 285. In this implementation, impurity doping can take place, for example, by the implantation and subsequent thermal annealing of dopant ions such as boron.

Once the P-well regions 280, 285 are formed, dielectric isolation regions 228 are formed in the P-well regions 280, 285 which are designed to separate and isolate between adjacent DRAM cells 202, 204. There are many known processes that can be used to form the dielectric isolation regions 228, so the process need not be described here in detail. One process for forming the dielectric isolation regions 228 is a shallow trench isolation (STI) process. In general, STI processes involve etching shallow trenches into the surface of the semiconductor layer 209 which are subsequently filled with an insulating material. After the trenches are filled with an insulating material, such as an oxide, the surface is usually planarized, for example by chemical mechanical planarization (CMP).

Figure 19:
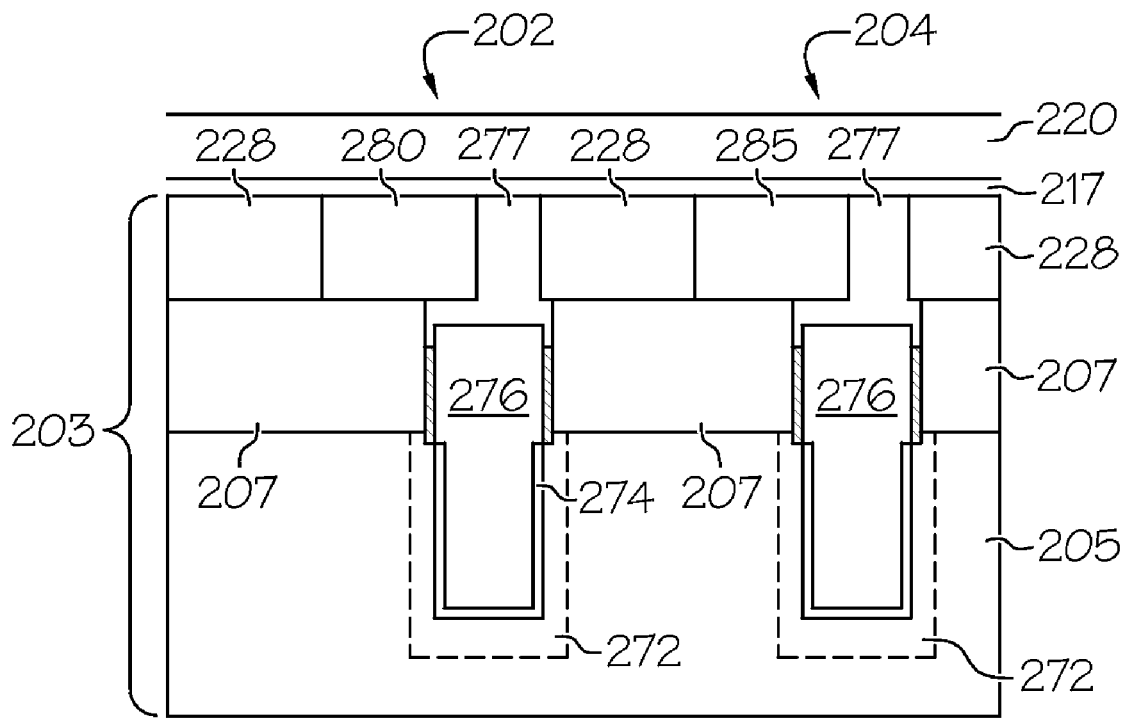

As illustrated in FIG. 19, a layer of gate insulating material 217 is formed overlying the dielectric isolation regions 228 and the P-well regions 280, 285, and one or more gate electrode layer(s) 220 are formed overlying the gate insulating material 217. In some implementations, the layer of gate insulating material 217 can be silicon dioxide, while in other implementations the layer of gate insulating material 217 can be one or more layers of high dielectric constant (κ) insulator materials having a high dielectric constant (κ) relative to silicon dioxide. Examples of "high-κ dielectric" materials are described above. In some implementations, the gate electrode material layer 220 can be polysilicon, while in other implementations the gate electrode material layer 220 can be one or more metal layers, which may be doped or undoped. Although not illustrated, in some embodiments, the gate electrode material layer 220 may have a composite structure with more than one layer, and each layer may be formed of any of the previously discussed materials. In one implementation, the gate electrode material layer 220 can also include a capping layer (not shown) that can be made of polycrystalline silicon. The gate electrode material layer(s) 220 can be formed using techniques such as CVD, physical vapor deposition (PVD), sputtering, etc. The gate electrode material layer(s) 220 are coupled to a word line 204 for the DRAM cells 202, 204.

Formation of the access transistors of the DRAM cells 202, 204 can be completed by well-known steps that can not be illustrated in the particular cross-sectional view that is shown in FIG. 19. For example, the gate insulating material 217 and gate electrode layer(s) 220 are patterned to form gate structures, and at least a surface portion of the P-well regions 280, 285 can be implanted with N-type conductivity determining impurities to create lightly doped extension regions. Impurity doping can take place, for example, by the implantation and subsequent thermal annealing of dopant ions such as arsenic or phosphorus. Sidewall spacers (not shown) are formed on sidewalls (not shown) of the various gate structures. N-type conductivity determining ions are implanted into exposed portions of each of the P-well regions 280, 285 and into exposed portions of the gate structures. Implanting N-type conductivity determining ions into the exposed portions of the P-well regions 280, 285 forms N-type source regions 230 and drain regions 240 that are self aligned with the gate structures, and defines P-type active body regions 235, 237 that underlie the gate structures between the N-type source regions 230 and drain regions 240. Referring back to FIG. 8, for example, the active body region 235 is defined in a portion of the well region 280 that is located between the source region 230 and the drain region 240, and underlies the gate electrode 220, while directly contacting the upper electrode 276, 277 of the trench capacitor 270.

The DRAM cells 202, 204 can be completed by well-known steps that can not be illustrated in the particular cross-sectional view that is shown in FIG. 19. For example, silicide regions or contact areas can be formed at the surface of the N-type source regions 240 and drain regions 230 of FIG. 8. One or more insulating or dielectric layer(s) may then be deposited. Openings can then be etched through the dielectric layer(s) to silicide regions 290 formed on the N-type drain regions 230, and filled with conductive material to form contacts to the N-type drain regions 230. Another layer of conductive material may then be deposited and patterned to form bit line 210 in contact with the contacts to the N-type drain regions 230.

Figure 1:
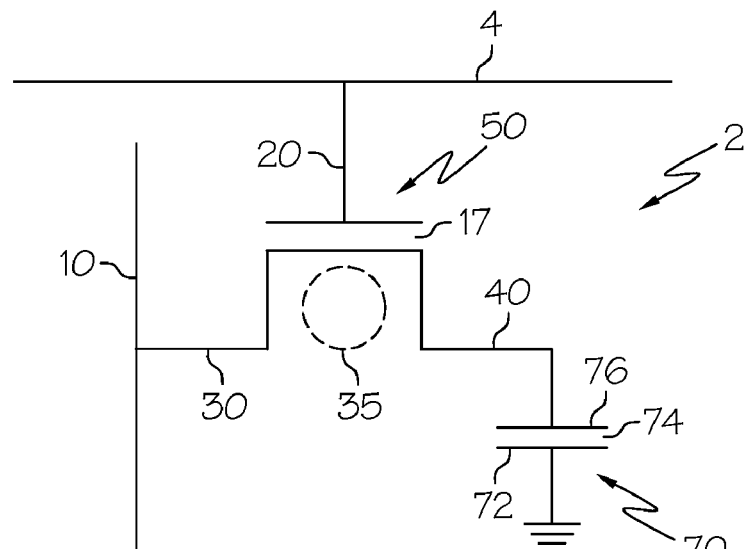
FIG. 1 is a circuit schematic which illustrates a conventional one transistor/one capacitor (1T/1C) dynamic random access memory (DRAM) cell.
Figure 2:
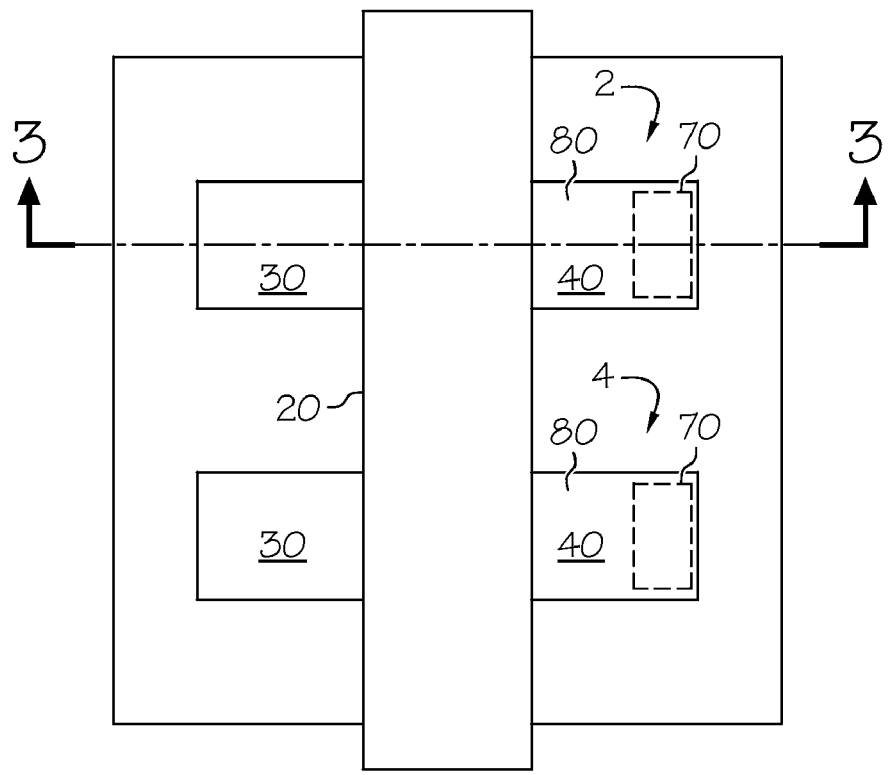
FIG. 2 illustrates, in plan view, two conventional 1T/1C dynamic random access memory (DRAM) cells.
Figure 3:
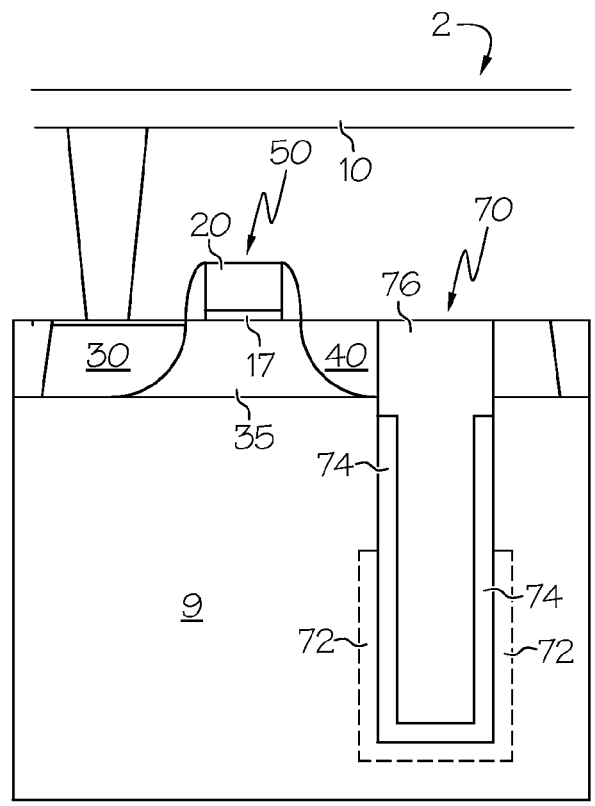
FIG. 3 illustrates, in cross section, one of the 1T/1C DRAM cells of FIG. 2.
Figure 4:
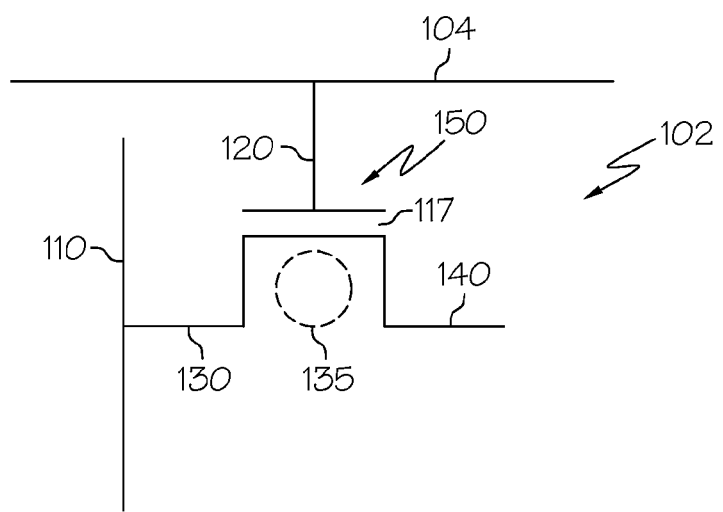
FIG. 4 is a circuit schematic which illustrates a conventional one transistor (1T) DRAM cell.
Figure 5:
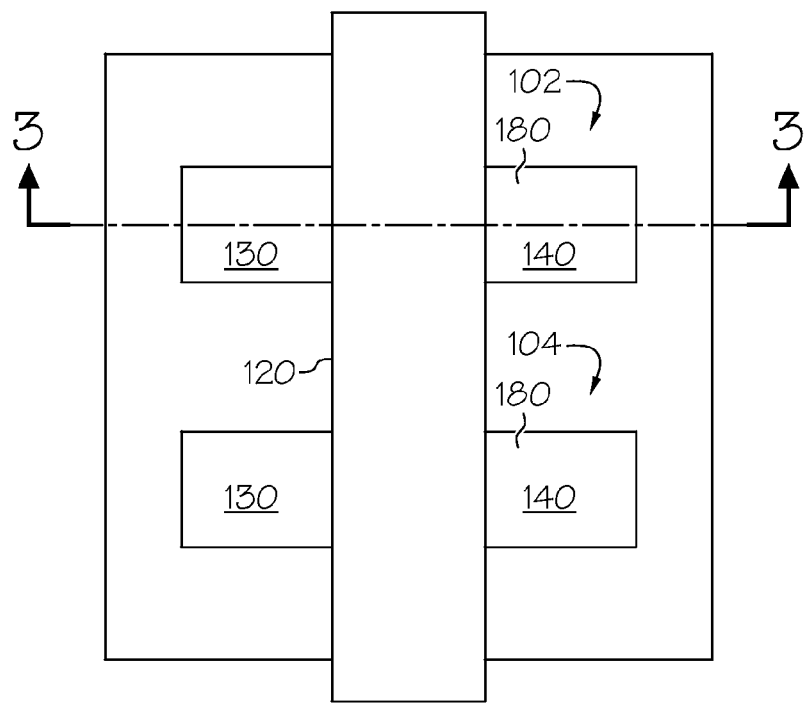
FIG. 5 illustrates, in plan view, two conventional one 1T DRAM cells.
Figure 6:
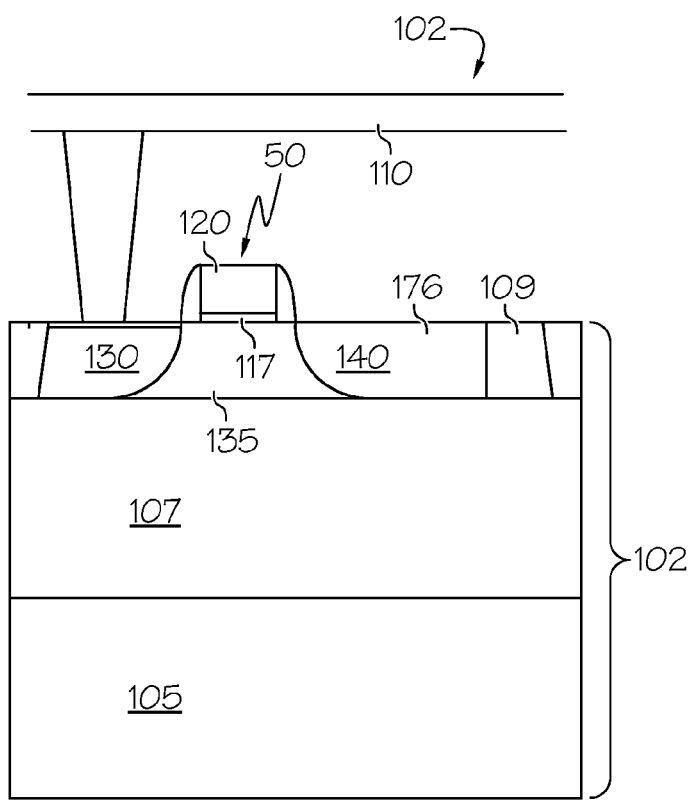
FIG. 6 illustrates, in cross section, one of the conventional 1T DRAM cells of FIG. 5.

Some of the resulting features of one of the resulting DRAM cells 202 will now be briefly described. The DRAM cell 202 includes an access transistor 250 formed in and on a SOI substrate 209, and a trench capacitor 270 is formed in contact with a doped well portion of the SOI substrate 209 that defines an active body region 235 of access transistor 250. The active body region 235 underlies and is capacitively coupled to the gate electrode 220 and trench capacitor 270. During operation, the active body region 235 is kept at a constant voltage ($V_{constant}$), such as Vdd level during a first data storage state (e.g., logic one (1)), and ground during a second data storage state (e.g., logic zero (0)). Information is stored in the active body region 235 using the "floating body effect." The trench capacitor 270 contacts an edge 269 of the active body region 235 such that the trench capacitor 270 is physically and directly coupled to the active body region 235. Because the trench capacitor 270 is coupled to the active body region 235, the total capacitance of the DRAM cell 202 is considerably greater than a conventional 1T DRAM cell, such as the DRAM cell 102 illustrated in FIGS. 4-6. As such, the trench capacitor 270 increases the charge storage capacity (i.e., capacitance) of the active body region 235 to increase data retention time and improve reliability of DRAM cell 202. Operation of the DRAM cell 296 will now be described.

During a first data storage state (e.g., logic one (1)), majority carriers accumulate in the active body region 235, and during a second data storage state (e.g., logic zero (0)), the majority carriers are removed from the active body region 235. The threshold voltage ($V_{TH}$) required to turn on the access transistor 250 changes (i.e., increases or decreases) based on the relative charge stored in the active body region 235. In particular, the threshold voltage ($V_{TH}$) required to turn the access transistor 250 on increases when the net charge stored in the active body region 235 decreases, and decreases when the net charge stored in the active body region 235 increases.

When the access transistor 250 is a NMOSFET the active body region 235 is P-type semiconductor material. Holes can be accumulated in the active body region 235 to store logic one (1) or high, whereas the lack of an abundance of holes can be used to store logic zero (0) or low. In other words, positive charge that is stored in the active body region 235 can be interpreted as a logic one, whereas an absence of this positive charge in the active body region 235 can be interpreted as a logic zero. To write and store a logic one (1) or high, a voltage in excess of the threshold voltage (VTH) is applied to the gate electrode to cause a current to flow from the source 230 to the drain region 240 to generate excess holes as the current flows through the channel thereby resulting in a "positively charged" active body region 235. To write and store a logic zero (0) or low, a voltage is not applied to the gate electrode and an abundance of positive charge is not induced in the active body region. The read operation does not involve directly measuring the quantity of charge present in the active body region 235. Instead, changes in threshold voltage ($V_{TH}$) are detected by detecting a change (i.e., increase or decrease) in the drain-to-source current ($I_{ds}$) to determine whether the memory cell 202 is storing a logic one (1) versus a logic zero (0). A increase in the drain-to-source current ($I_{ds}$) can be interpreted as a logic one, whereas an decrease in the drain-to-source current ($I_{ds}$) can be interpreted as a logic zero Although the embodiments above with respect to FIGS. 9-19 describe a method for DRAM cells 202, 204 in which the access transistors 250, 254 are NMOSFET devices, in alternative embodiments (not shown), similar techniques can be used to fabricate DRAM cells 202, 204 in which the access transistors 250, 254 are PMOSFET devices. In such embodiments, the semiconductor layer can be doped with N-type conductivity determining impurities to create N-well regions (not shown) in the semiconductor layer 209. Impurity doping can take place, for example, by the implantation and subsequent thermal annealing of dopant ions such as arsenic or phosphorous. In an alternate PMOS embodiment, P-type conductivity determining impurities, such as boron, can be used as dopants during the processing steps described above with respect to FIGS. 9-19 in which N-type conductivity determining impurities are used for doping.

While at least one exemplary embodiment has been presented in the foregoing detailed description, it should be appreciated that a vast number of variations exist. For instance, although embodiments that have been described above in the context of DRAM cells, other embodiments of the present invention can implement a trench capacitor attached to the active body region of the access transistor that is used in other types of memory cells such as Gated Lateral Thyristor (GLT) memory cells. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a memory cell, the method comprising:
    providing a semiconductor-on-insulator (SOI) structure that comprises: a carrier wafer substrate; a semiconductor layer; and a buried oxide insulating layer disposed between the carrier substrate and the semiconductor layer;
    forming a trench in the SOI structure that extends into the carrier substrate;
    forming a trench capacitor in the trench;
    directly coupling the trench capacitor to a well region formed in the semiconductor layer by implanting conductivity determining impurities into the semiconductor layer;
    forming a gate structure overlying a portion of the well region; and
    defining an active body region in a portion of the well region by implanting conductivity determining ions into portions of the well region to form a source region and a drain region, wherein the active body region directly contacts the trench capacitor and is defined between the source region and the drain region.

2. A method according to claim 1, wherein the step of forming a trench in the SOI structure that extends into the carrier substrate, comprises the steps of:
    forming a first trench in the SOI structure; and
    extending the first trench to form a second trench that extends further into the carrier substrate.

3. A method according to claim 2, wherein the step of forming a first trench in the SOI structure comprises the steps of:
    forming a protective layer overlying the semiconductor layer, wherein the protective layer comprises: a pad layer, a pad stop layer, and a hard mask layer;
    patterning a photosensitive mask to define an opening that exposes a portion of the hard mask layer; and
    anisotropically etching the SOI structure to define a first trench having sidewalls and a bottom.

4. A method according to claim 3, wherein the method further comprises the step of:
    forming protective spacers on the sidewalls of the first trench.

5. A method according to claim 3, wherein the step of extending the first trench to form a second trench that extends further into the carrier substrate comprises the step of:
    anisotropically etching an exposed portion of the carrier substrate at the bottom of the first trench to create a second trench that extends further into the carrier substrate and exposes portions of the carrier substrate, wherein the second trench has lower portions.

6. A method according to claim 5, wherein the step of forming a trench capacitor in the trench, comprises the steps of:
    doping exposed portions of the carrier substrate that surround lower portions of the second trench;
    forming a dielectric layer on exposed sidewalls and a bottom portion of the second trench;
    depositing a polycrystalline silicon layer in the second trench, and removing part of the polycrystalline silicon layer to leave a polycrystalline silicon plug that lies below the semiconductor layer; and
    depositing a conductive layer overlying the polycrystalline silicon plug to physically connect the polycrystalline silicon plug to the semiconductor layer.

7. A method according to claim 6, wherein the method further comprises the steps of:
    selectively etching the remaining portions of the pad stop layer and portions of the protective spacers with respect to the polycrystalline silicon plug to remove remaining portions of the pad stop layer and portions of the protective spacers and to leave remaining portions of the protective spacers intact.

8. A method according to claim 1, wherein the method further comprises the steps of:
    forming dielectric isolation regions in the well region.

9. A method according to claim 8, wherein the step of forming a gate structure overlying a portion of the well region comprises the steps of:
    forming a layer of gate insulating material overlying the dielectric isolation regions and the well regions;
    forming a gate electrode layer overlying the gate insulating material and at least a portion of the trench capacitor; and
    patterning the gate electrode layer and the layer of gate insulating material to form a gate structure overlying a portion of the well region.

10. A method according to claim 9, wherein the step of implanting conductivity determining ions into other portions of the well region to form a source region and a drain region, and to define an active body region between the source region and the drain region, comprises the steps of:
    implanting conductivity determining ions into exposed portions of the well region to form a source region and a drain region that are self aligned with the gate structure, and to define an active body region between the source region and the drain region in a portion of the well region that underlies the gate structure, wherein the active body region directly contacts the upper electrode of the trench capacitor.

11. A method for fabricating a DRAM cell, the method comprising:
providing a semiconductor-on-insulator (SOI) structure that comprises: a carrier wafer substrate comprising a silicon material; a semiconductor layer; and a buried oxide insulating layer disposed between the carrier substrate and the semiconductor layer;
forming a trench in the SOI structure that extends into the carrier substrate, wherein the trench includes exposed sidewalls and a bottom portion;
introducing an dopant into the trench and thermally diffusing the dopant into exposed portions of the carrier substrate that surround lower portions of the trench;
forming a dielectric layer on the exposed sidewalls and the bottom portion of the trench;
depositing a polycrystalline silicon layer in the trench in contact with the dielectric layer, wherein the polycrystalline silicon layer physically connects to the semiconductor layer;
implanting conductivity determining impurities into the semiconductor layer to create a well region that is directly coupled to the polycrystalline silicon layer;
forming shallow trench isolation regions in the well region to electrically isolate a portion of the well region;
forming a gate structure overlying a portion of the well region; and
implanting conductivity determining ions into other portions of the well region to form a source region and a drain region, and to define an active body region that underlies the gate structure between the source region and the drain region, wherein the active body region directly contacts the trench capacitor.

12. A method according to claim 11, further comprising the step of:
sequentially depositing a first oxide layer, a first nitride layer, and a second oxide layer overlying the semiconductor layer.

13. A method according to claim 12, wherein the step of forming a trench in the SOI structure that extends into the carrier substrate, comprises the steps of:
providing a photosensitive mask having an opening that exposes a portion of the second oxide layer;
anisotropically etching through the second oxide layer, the first nitride layer, the first oxide layer and the semiconductor layer into the buried oxide insulating layer to form the first trench having exposed sidewalls and the bottom portion;
forming protective spacers on the sidewalls of the first trench that extend to the bottom of the first trench; and
anisotropically etching a portion of the carrier substrate at the bottom of the first trench to create a second trench that extends further into the carrier substrate.

14. A method according to claim 13, wherein the step of depositing a polycrystalline silicon layer in the trench in contact with the dielectric layer comprises the steps of:
depositing a first doped polycrystalline silicon layer in the second trench, and etching the first doped polycrystalline silicon layer to remove part of the first doped polycrystalline silicon layer and to leave a doped polycrystalline silicon plug that lies below the semiconductor layer; and
depositing a second doped polycrystalline silicon layer in the remainder of the second trench that physically connects the doped polycrystalline silicon plug to the semiconductor layer to form an upper electrode of the trench capacitor.

15. A method according to claim 14, wherein the doped polycrystalline silicon plug is surrounded by the protective spacers in a portion of the buried oxide insulating layer and by the dielectric layers in a portion of the carrier substrate, wherein the method further comprises the steps of:
selectively etching the remaining portions of the first nitride layer and portions of the protective spacers with respect to the doped polycrystalline silicon plug to remove remaining portions of the first nitride layer and portions of the protective spacers and to leave remaining portions of the protective spacers intact.

16. A method according to claim 14, wherein the carrier wafer substrate comprises a p-type silicon material, wherein the buried plate electrode comprises an n-type silicon material, wherein the upper electrode comprises n-type doped polycrystalline silicon, wherein the well region comprises a p-well region, and wherein the step of implanting conductivity determining ions into other portions of the well region to form a source region and a drain region, and to define an active body region between the source region and the drain region, comprises:
implanting n-type conductivity determining ions into exposed portions of the p-well region to form an n-type source region and an n-type drain region that are self aligned with the gate structure, and to define a p-type active body region between the n-type source region and the n-type drain region in a portion of the p-well region that underlies the gate structure.

17. A method according to claim 16, wherein the p-type active body region directly contacts the upper electrode of the trench capacitor.

18. A method for fabricating a memory cell, the method comprising:
providing a semiconductor structure that comprises a semiconductor layer;
forming a trench in the semiconductor structure;
forming a trench capacitor in the trench;
implanting conductivity determining impurities into the semiconductor structure to create a well region in the semiconductor layer that is directly coupled to the trench capacitor;
forming a gate structure overlying a portion of the well region; and
implanting conductivity determining ions into other portions of the well region to form a source region and a drain region, and to define an active body region between the source region and the drain region, wherein the active body region directly contacts the trench capacitor.

19. A method according to claim 1, wherein the active body region is the portion of the well region that is defined between the source region and the drain region.

20. A method according to claim 1, wherein the trench capacitor directly underlies the gate structure.

21. A method according to claim 1, wherein all portions of the trench capacitor are disposed below the gate structure within the SOI structure.

22. A method according to claim 11, wherein the active body region is the portion of the well region that is defined between the source region and the drain region.

23. A method according to claim 11, wherein the trench capacitor directly underlies the gate structure.

24. A method according to claim 11, wherein all portions of the trench capacitor are disposed below the gate structure within the SOI structure.

25. A method according to claim 18, wherein the active body region is the portion of the well region that is defined between the source region and the drain region.

26. A method according to claim 18, wherein the trench capacitor directly underlies the gate structure.

27. A method according to claim 18, wherein all portions of the trench capacitor are disposed below the gate structure within the semiconductor structure.

* * * * *